United States Patent [19]

Harford et al.

[11] Patent Number: 5,331,290
[45] Date of Patent: Jul. 19, 1994

[54] VARIABLE GAIN AMPLIFIER

[75] Inventors: Jack R. Harford, Flemington, N.J.; Heung B. Lee, Suwon, Rep. of Korea

[73] Assignee: SamSung Electronics Co., Ltd., Suwon, Rep. of Korea

[21] Appl. No.: 940,220

[22] Filed: Sep. 8, 1992

[51] Int. Cl.[5] .......................... H03F 3/45; H03G 3/30
[52] U.S. Cl. ..................................... 330/254; 330/282
[58] Field of Search ............... 330/129, 254, 273, 282, 330/283

[56] References Cited

U.S. PATENT DOCUMENTS

| | | |
|---|---|---|
| 3,241,078 | 3/1966 | Jones . |
| 3,290,520 | 12/1966 | Wennik . |
| 3,513,256 | 5/1970 | Bilotti . |
| 3,522,548 | 8/1970 | Heuner et al. . |
| 3,541,466 | 11/1970 | Yee ..................... 330/252 |
| 3,577,008 | 5/1971 | Craft . |
| 3,627,915 | 12/1971 | Schellekens et al. . |
| 3,651,418 | 3/1972 | Wittmann . |
| 3,707,603 | 12/1972 | Limberg ................... 381/11 X |
| 4,342,005 | 7/1982 | Harford ..................... 330/254 |
| 4,464,632 | 8/1984 | Yoshihisa et al. ............ 330/254 |
| 4,531,097 | 7/1985 | Götz et al. ................. 330/254 |
| 4,718,086 | 1/1988 | Rumreich et al. ........... 358/174 X |

FOREIGN PATENT DOCUMENTS

| | | |
|---|---|---|
| 537202 | 10/1931 | Fed. Rep. of Germany . |
| 1925271 | 9/1975 | Fed. Rep. of Germany . |
| 1201015 | 8/1970 | United Kingdom . |

Primary Examiner—Steven Mottola
Attorney, Agent, or Firm—Robert E. Bushnell

[57] ABSTRACT

Variable-gain amplifier stages, such as may be used in a television receiver intermediate-frequency (IF) amplifier, each comprise a pair of transistors connected as an emitter-coupled differential amplifier with resistive collector loads. An electrically controlled conductance is connected between the collector electrodes of the transistors, to shunt the resistive collector loads in controllable amount to set the voltage gain of the stage. The electrically controlled conductance in each variable-gain amplifier stage is constructed so as not to change the DC operating conditions of the emitter-coupled differential amplifier and its resistive collector loads with variation in the conductance of the electrically controlled conductance. Front end portions of television receivers or video tape recorders are described each of which uses separate intermediate-frequency (IF) amplifiers for the FM sound carrier and vestigial-AM picture carrier. In each front end the two IF amplifiers comprise matched cascade connections of the variable-gain amplifiers with tracking automatic gain control (AGC). The AGC signals are generated by an AGC detector supplied composite video signal from a video detector, which video detector responds to amplified IF signal supplied by the IF amplifier for the vestigial-AM picture carrier.

27 Claims, 6 Drawing Sheets

VARIABLE GAIN AMPLIFIER

FIELD OF THE INVENTION

The present invention relates to the field of variable- or controllable-gain amplifiers and more specifically, but not exclusively, to composite signal intermediate frequency (IF) amplifiers, such as are typically utilized in television (TV) receivers and video cassette recorders (VCR's), also referred to as "PIX IF amplifiers".

BACKGROUND OF THE INVENTION

In television receivers a down-conversion is carried out by heterodyning the incoming radio-frequency (RF) signals of different transmission channels with the oscillations of a tunable-frequency oscillator, thereby to generate lower-in-frequency radio-frequency signals within an intermediate-frequency (IF) band which is selected and amplified in an intermediate-frequency (IF) amplifier. An intermediate-frequency amplifier for the video portion of a television signal is commonly termed the "PIX IF amplifier". An intermediate-frequency amplifier for the sound portion of a television signal may be separate from the PIX IF amplifier or, alternatively, may include the PIX IF amplifier as is the case in TV sets of the intercarrier sound type. A PIX IF amplifier is typically required to handle signals ranging from about 50 microvolts to about 100 millivolts RMS. This represents a dynamic range of about 66 dB.

Within this specification the term "RF signal" shall be used in reference to signals at points in a television receiver before the down-conversion, or first detection; and the term "IF signal" shall be used in reference to signals at points in a television receiver after the down-conversion, or first detection, and before video detection, or second detection. In the claims following this specification, however, the term "RF signal" shall be used in reference to signals at all these points in a television receiver; and the term RF amplifier is to be construed as comprising IF amplifiers as well as other types of RF amplifier.

In providing an automatic gain control (AGC) function, it is desirable that certain operating conditions be met for each amplifier stage or device. Thus, the input signal level should exceed the internal noise by a predetermined factor, and the input signal level should not overload the device and thereby cause signal distortion and a bias shift. Furthermore, the AGC control signal should not itself cause undesirable bias shifts and thereby cause devices to be shifted from their intended operating points. E.g., the operating points for amplifiers and mixers are chosen to provide for low distortion in their output signals, and the operating points for mixers and detectors are chosen to provide for relatively high second-order responses.

At relatively strong signal levels in the order of 1 millivolt or more, it is particularly important that the gain be controlled in a manner that takes into account the so-called "noise/overload window". If, on the one hand, the gain of an earlier stage of a multiple-stage amplifier is reduced too little, overload with distortion undesirably may occur in a later stage. If, on the other hand, if the gain in an earlier stage is too low, thermal noise may become noticeable. It is desirable that a substantially noise-free and undistorted picture be achievable for an input signal level corresponding to 10 millivolts or so, measured at typical impedance levels. If an amplifier exhibits an inadequate noise/overload window, it may contribute noise or overload distortion at signal levels where a low distortion, relatively noise-free picture should be possible.

The development of integrated-circuit (IC) gain blocks spurred the need for block filtering. Recent practice has been to implement the IF filtering and gain functions in TV receivers in the configuration of a block filter followed by a gain-block IC amplifier. A surface-acoustic-wave (SAW) filter can provide the entire passband shape and adjacent channel attenuation required by a television receiver. Additional information on SAW filters and on block filtering and amplification may be found, for example, in Chapter 13 of the book TELEVISION ENGINEERING HANDBOOK; K. Blair Benson, Editor in Chief; McGraw-Hill Book Company, New York; 1986.

While the advent of block filtering and amplification has been generally desirable in the TV receiver art, it has nevertheless aggravated the problem of the noise/overload window for a number of reasons. Typical commercially available SAW filters used as a lumped filter at the input of an IF amplifier exhibit high insertion loss and high impedance, thereby acting as a relatively high level noise source impedance. The noise margin side of the noise/overload window is thereby reduced. Furthermore, noise signals falling within +/− 4.5 MHz of the picture carrier will be demodulated as noise that is "folded" into the 0–4.5 MHz video band.

This arises as follows. The IF signal lies within the band of 41.25–45.75 MHz. With the use of lumped or block filtering at the input of an IF amplifier, the sideband noise of IF stages following the filter is not suppressed as was the case when filtering was distributed stage by stage. This is because the noise within the band of +/− 4.5 MHz centered about the (IF) picture carrier frequency of 45.75 MHz is not filtered by the lumped filter ahead of the amplifier.

Another effect which tends to aggravate the noise/overload window problem in the block filtering and amplification procedure is that the typical bipolar IC amplifier utilized exhibits a transfer characteristic having a fixed overload voltage level, which restricts the overload side of the noise/overload window. Furthermore, typical modern small geometry bipolar transistors tend to exhibit a high base access resistance ($r_b$) and hence tend to have a worse noise figure than larger, optimized devices having low $r_b$; this aggravates the problem.

The inventors recognize that the noise/overload window can be extended on the overload side by utilizing transistors of different design and, on the noise side by transforming the SAW filter output impedance to a lower value, thereby reducing its contribution as a noise source. However, impedance matching arrangements such as transformers or other matching circuits are costly, bulky, and raise the gain requirements on a system that already has high gain.

The problem of the noise/overload window is further complicated by the fact that each of certain ones of prior-art gain-controlled IF amplifiers exhibits a shift of its output bias voltage as a function of gain control. Generally, this results in a change of bias voltage on the demodulator, which is typically direct coupled to the IF amplifier. As was mentioned above with regard to operating points, such change is undesirable. As a result of the shifting bias conditions, adequate bias voltage must be provided to accommodate the changes, thereby complicating the demodulator design and necessitating a higher supply voltage than is otherwise required for low distortion.

A basic amplifier stage that is often used in IF amplifiers is the long-tailed pair or emitter-coupled differential amplifier, which includes two transistors with a "tail" connection between their emitter electrodes to which a constant current generator connects. The constant current generator may be provided by a high-resistance resistor between the tail connection and a remote direct potential; but in ICs, where there is a desire to use smaller operating potentials in order to keep dissipation within acceptable bounds, the constant current generator is generally provided by the principal conduction path of another transistor biased for constant current operation. While the long-tailed pair is oftentimes referred to as an emitter-coupled "differential" amplifier, in fact, it is often operated with a single-ended input circuit, a single-ended output circuit, or both. It is recognized herein that gain control may be effected by the straightforward reduction of the operating or tail current of an emitter-coupled differential amplifier, thereby reducing its mutual conduction in a known manner. However, there are drawbacks to the simple application of this approach. First, the noise source resistance is increased as gain decreases, thereby negating to an extent the improved signal-to-noise ratio associated with a larger signal and second, the power handling capability is reduced when it is most needed to handle a larger signal.

Prior-art untuned amplifiers, constructed in IC form and used after block filtering for television-receiver IF amplification in commercially successful TV receiver designs, have used three successive gain-controlled stages in order to meet the dynamic range requirements of about 66 dB for such service. These designs have used reverse AGC, in which the transconductances of the amplifier transistors are reduced in order to effect gain reduction. The voltage gain of an undegenerated common-emitter transistor amplifier is $g_m R_L$, where $g_m$ is the transconductance of the transistor and $R_L$ is the resistance of the collector load used with the transistor. The reduction of the transconductances of the amplifier transistors raises the resistances of the noise sources presented to their collector electrodes, increasing the thermal noise generated by the transistors and thus making it necessary to use three successive gain-controlled stages in order to keep the overall noise figure for the PIX IF amplifier chain low enough to meet commercial requirements. An alternative approach for reducing the gains of cascaded amplifier stages is to reduce the collector resistances used with the transistors, the well known forward AGC being an example of this approach. If the transconductances of the transistors are not reduced, there is no attendant increase in the thermal noise generated by the transistors; and reducing the collector resistances used with the transistors reduces the voltages associated with the currents generated by their thermal noise.

The inventors sought two-stage untuned amplifiers constructed in IC form that could, without need for unit-by-unit adjustments, reproducibly provide television-receiver IF amplification with 66 dB dynamic range. Reduction in the number of gain-controlled amplifier stages was sought in order to reduce power supply requirements, including power supply decoupling filtering between voltage-amplifier stages; to reduce the likelihood of self-oscillatory tendencies in portions of the gain control range owing to excessive phase shifting through the amplifier chain at frequencies where voltage gain was still appreciably large; and to simplify automatic-gain-control (AGC) tracking among the gain-controlled amplifier stages in the IF and RF portions of the television receiver. To reduce self-oscillatory tendencies in portions of the gain control range still further, the inventors perceived, it is desirable to have controlled-gain amplifiers that are quite symmetrical in structure so that balanced signal operation may be pursued, especially further on in the amplifier chain, and so that the amplifier chain can be laid out symmetrically on the IC. These steps reduce the positive feedback via stray capacitance from later to earlier portions of the amplifier chain.

SUMMARY OF THE INVENTION

In accordance with an aspect of the invention, a gain-controlled amplifier stage comprises:

first and second transistors having respective emitter electrodes, respective base electrodes, and respective collector electrodes;

circuitry for connecting the first and second transistors in emitter-coupled differential amplifier configuration, which circuitry is of such nature that a direct base bias voltage is applied to the base electrodes of both the first and second transistors, an input signal voltage is applied between the base electrodes of the first and second transistors, the emitter electrodes of the first and second transistors are coupled together, and there are similar direct emitter current flows through the first and second transistors;

a first resistance, having a first end connected to conduct the entirety of a direct current flowing through the collector electrode of the first transistor responsive to its the direct emitter current flow, and having a second end;

a second resistance, having a first end connected to conduct the entirety of a direct current flowing through the collector electrode of the second transistor responsive its direct emitter current flow, and having a second end;

circuitry for applying a direct operating voltage to the second ends of the first and the second resistances;

circuitry for taking an output signal voltage from at least one of the first ends of the first and the second resistances; and circuitry for providing a controllable conductance between the first ends of the first and the second resistances, which the circuitry for providing a controllable conductance includes:

first and second diodes of unilaterally conductive type, having respective first electrodes respectively connecting to the first end of the first resistance and to the first end of the second resistance, and having respective second electrodes connecting together at a control mode; and means for supplying a direct control current to the control node for controlling the unilateral conduction of the first and second diodes which direct control current has a value regulated responsive to an electric control signal, which electric control signal is applied to the means for supplying a direct control current through connections other than at the second ends of the first and second resistances.

In accordance with another aspect of the invention, a gain-controlled amplifier stage comprises:

first and second transistors having respective emitter electrodes, respective base electrodes, and respective collector electrodes;

circuitry for connecting the first and second transistors in emitter-coupled differential amplifier configuration, which circuitry is of such nature that a direct base bias voltage is applied to the base electrodes of both the first and second transistors, an input signal voltage is applied between the base electrodes of the first and second transistors, the emitter electrodes of said first and second transistors are coupled together, and there are similar direct emitter current flows through the first and second transistors;

first and second resistances having respective first ends coupled to the respective collector electrodes of the first and second transistors and having respective second ends connected for receiving a direct operating voltage;

a source of control current, which exhibits a source impedance value within a range extending upward from a value comparable with the impedance of said first and second resistances; and circuitry for providing a controllable conductance between the first ends of said first and said second resistances, which controllable conductance circuitry is arranged to be controlled responsive to said control current and comprises first and second variable conductance elements having respective first ends connected to said respective first ends of the first and second resistances and having respective second ends connected together to receive the first control current from said source thereof.

In accordance with yet another aspect of the invention, a gain-controlled amplifier comprises:

first and second transistors connected as an emitter-coupled differential amplifier for responding to RF signals and having respective collector electrodes for supplying respective collector currents having respective common-mode DC components and having respective differential-mode RF components;

a bridge diode load arrangement having first, second, third, and fourth nodes, the first and second nodes being balanced with respect to the third and fourth nodes, the first and second nodes being connected to respective ones of the collector electrodes, the diode load arrangement exhibiting between the first and second nodes a controllable impedance having a value controlled by current flow between the third and fourth nodes; and variable control current circuitry comprising a current source output connected to the third node and a current sink output connected to the fourth node, the current source and sink outputs providing equal magnitudes of current.

In accordance with still another aspect of the invention, a gain-controlled amplifier comprises:

first and second transistors having respective base, emitter and collector electrodes;

means for connecting the first and second transistors in an emitter-coupled differential amplifier configuration, to cause the first and second transistors to respond to RF signals received between their base electrodes for supplying from their respective collector electrodes respective collector currents having respective common-mode DC components and having respective differential-mode RF components;

a controllable current splitter having an input for receiving a direct operating current to be split into first and second fractional parts in a ratio determined in accordance with a control signal and having first and second outputs for providing the first and second fractional parts of said direct operating current to the emitter electrodes of the first and second transistors, respectively;

a first resistance connected between the collector electrode of the first transistor and a point of operating potential;

a second resistance connected between the collector electrode of the second transistor and the same point of operating potential;

a first diode having a first electrode to which the collector electrode of the first transistor is connected and having a second electrode;

a second diode having a first electrode to which the collector electrode of the second transistor is connected and having a second electrode; and an interconnection between the second electrodes of said first and second diodes to which the second output of said the current splitter is connected.

In accordance with still yet another aspect of the invention, a gain-controlled amplifier comprises:

first and second transistors having respective base, emitter and collector electrodes;

means for connecting the first and second transistors in an emitter-coupled differential amplifier configuration, to cause the first and second transistors to respond to RF signals received between their base electrodes for supplying from their respective collector electrodes respective collector currents having respective common-mode DC components and having respective differential-mode RF components;

a first controllable current splitter, having an input for conducting collector current from said first transistor, and having first and second outputs for respectively conducting first and second fractional parts of said first current in a ratio determined in accordance with a control signal;

a second controllable current splitter, having an input for conducting collector current from said second transistor, and having first and second outputs for respectively conducting first and second fractional parts of said second current in a ratio determined in accordance with said control signal;

a first resistance connected between said point of operating potential and a first node, to which said first node the first output of said first current splitter connects;

a second resistance connected between said point of operating potential and a second node, to which said second node the first output of said second current splitter connects;

first diode means having a first electrode connected to said first node and having a second electrode;

second diode means having a first electrode connected to said second node and having a second electrode; and a third node at which said second electrodes of said first and second diode means connect together and to which the second outputs of said first and second current splitters each connect.

In still further embodiments of the invention, each of a number of gain-controlled cascade amplifiers comprises one of the aforementioned gain-controlled amplifiers in cascade coupling after another one of the aforementioned gain-controlled amplifiers. In preferred ones of these embodiments, a gain control signal for the gain-controlled amplifier at the input of the cascade connection is delayed in its operation relative to the operation of a gain control signal for the gain-controlled amplifier at the output of the cascade connection.

BRIEF DESCRIPTION OF THE DRAWING

The invention will be more fully understood from the following detailed description of the preferred embodiments in conjunction with the drawing, briefly described as follows.

DETAILED DESCRIPTION

Figure 1:
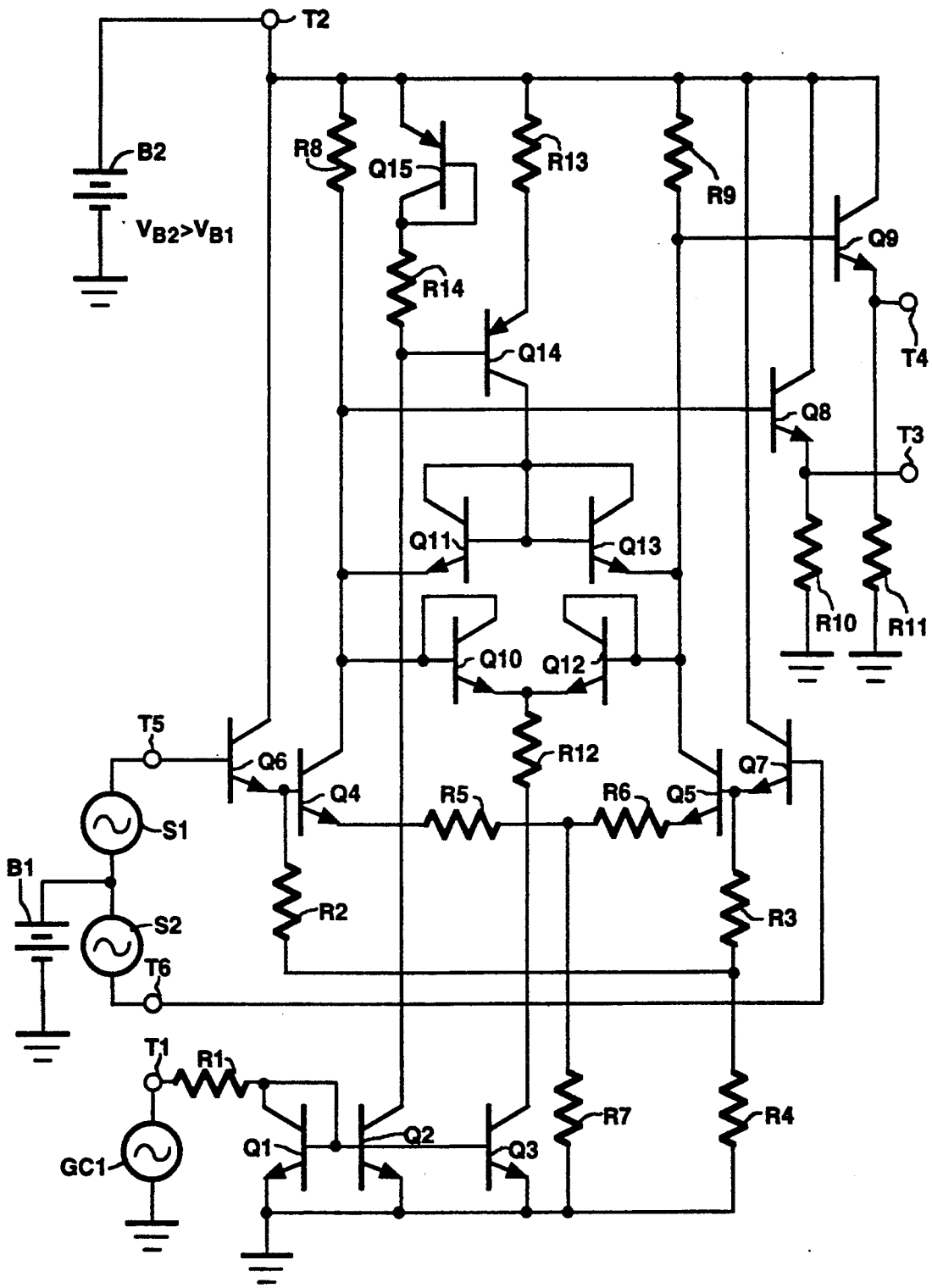
FIG. 1 is a schematic diagram of a gain-controlled amplifier stage that embodies the invention in one of its aspects and that is particularly well-suited for use as the input stage of a plural-stage IF amplifier.

Referring to FIG. 1, Q1 is a bipolar transistor, having a base electrode for controlling conduction through a principal conduction path between emitter and collector electrodes, as is also the case with other bipolar transistors to be hereinafter referred to in the description. Transistor Q1 is of NPN conductivity type and has its base and collector electrodes conductively joined so as to operate in a diode-connected mode. The emitter electrode of Q1 connects to a source of a reference potential, here shown as ground. A reference current is supplied to the joined base and collector electrodes via a resistance R1 having one end thereof connected to those joined electrodes and having another end thereof connected to receive a automatic-gain-control (AGC) signal potential applied at a terminal T1. FIG. 1 shows the AGC signal potential originating from a generator GC1 being applied at a terminal T1.

NPN transistors Q2 and Q3 have their respective emitter electrodes connected to the same reference potential as the emitter electrode of Q1 and their base electrodes connected to the base electrode of Q1, so as to form a current mirror arrangement with respect to the reference current supplied via R1. The emitter electrodes of NPN transistors Q4 and Q5 are each connected to one end of respective resistances R5 and R6 whose other ends are connected together and are connected to a point at ground reference potential via a series resistance R7, so that transistor Q4 and Q5 form a different pair, with resistance R7 supplying operating current or tail current to the differential pair.

The base electrodes of NPN transistors Q6 and Q7 are connected to respective signal input terminals T5 and T6 for receiving a differential input signal and accompanying direct bias potential thereat. FIG. 1 shows a battery B1 with its negative terminal connected to a point of ground reference potential supplying a positive direct bias potential V at its positive terminal against which are referred balanced input signals supplied by generators S1 and S2 to the base electrodes of Q6 and Q7. Transistors Q6 and Q7 are connected as common-collector amplifiers to provide voltage followers of the emitter-follower type. Their respective emitter electrodes connect to respective ones of the base electrodes of Q4 and Q5 and to one end of respective resistances R2 and R3. The other ends of R2 and R3 are connected together and to one end of a resistance R4 whose other end is connected to ground. Transistors Q6 and Q7 have their collector electrodes connected to receive a positive operating potential $V_{B2}$ applied to a supply terminal T2, shown in FIG. 1 as being supplied from the positive terminal of a battery B2 having its negative terminal connected to a point at reference ground potential.

The collector electrodes of Q4 and Q5 are connected to supply terminal T2 via respective series resistance R8 and R9. The collector electrode of Q4 is further connected to the base electrode of an NPN transistor Q8, the collector electrode of which connects to T2. The emitter electrode of Q8 is connected to an output terminal T3 and is further connected to ground reference potential via a series resistance R10. The collector electrode of transistor Q5 is further connected to the base electrode of an NPN transistor Q9, the collector electrode of which connects to T2. The emitter electrode of Q9 is connected to an output terminal T4 and is further connected to ground reference potential via series resistance R11.

The collector electrode of transistor Q4 is further connected to the joined collector and base electrodes of an NPN transistor Q10 and to the emitter electrode of an NPN transistor Q11. The collector electrode of transistor Q5 is further connected to the joined collector and base electrodes of an NPN transistor Q12 and to the emitter electrode of an NPN transistor Q13. The joined emitter electrodes of transistors Q10 and Q12 are connected to the collector electrode of transistor Q3 via a series resistance R12. The joined collector and base electrodes of transistors Q11 and Q13 are connected to the collector electrode of a PNP transistor Q14, the emitter electrode of which is connected to supply terminal T2 via a series resistance R13. The base electrode of transistor Q14 is connected to the collector electrode of Q2 and is further connected via a series resistance R14 to the base and collector electrodes of a PNP transistor Q15. The emitter electrode of diode-connected transistor Q15 is connected by supply terminal T2.

In operation, diode-connected transistors Q10, Q11, Q12, and Q13, in conjunction with resistors R8 and R9, from a variable load for the collector electrodes of the emitter-coupled differential amplifier transistors Q4 and Q5. The output signal is buffered by Q8 and Q9 operating as voltage followers of the emitter-follower type. The DC through diode-connected transistors Q10, Q11, Q12, and Q13 is determined by the current mirror output current in the collector electrode of Q3 and in the equal collector current of Q2, as thereafter mirrored by the current mirror formed by PNP transistors Q14 and Q15. When these currents are zero, as will occur when the current in resistance R1 is zero, diode-connected transistors Q10, Q11, Q12, and Q13 present high impedances. Consequently, the amplifier gain as determined by the gain of the differential pair amplifier is at a maximum, being defined by the collector resistors.

When current is applied to diode-connected transistors Q10, Q11, Q12, and Q13, responsive to increasing the positive potential at terminal T1, their impedance becomes relatively low and the gain of the emitter-coupled differential amplifier comprising Q4 and Q5 is reduced. The collector electrodes of transistors Q3 and Q14 source and sink closely equal currents so that the same current enters as leaves the network comprising diode-connected transistors Q10, Q11, Q12, and Q13. Under this condition, no current is added to or removed from the collector electrode nodes of Q4 and Q5. Thus, if diode-connected transistors Q10, Q11, Q12, and Q13, and the transistors supplying current to them are well matched, there will be no disturbance of the DC conditions of operation of the amplifier as the gain is changed and thereby the problems referred to in connection with prior art arrangements are avoided and cascading of stages is facilitated. Such matching is readily accomplished on a monolithic IC. Furthermore, the network comprising diode-connected transistors Q10, Q11, Q12, and Q13 is in the form of a bridge, so that the nodes where currents are supplied to the network are at AC ground, forming a "virtual ground" for RF currents. One result of this is that the PNP transistor Q14 carries only DC and its collector capacitance does not affect the frequency response of the amplifier. Another effect is that there is no signal return to ground through the diode-connected transistors Q10, Q11, Q12, and Q13.

It is also noted that the gain control variable elements are in the collector circuit of the differential pair amplifier, thereby allowing design freedom in biasing the emitter circuit for large signal handling capability and so extending the overload characteristic. Furthermore, the power required to effect gain control is limited.

In the embodiment of the invention described above (and in the embodiments of the invention described below) the collector loads of the emitter-coupled differential amplifier are just the resistive loads at maximum gain, since the diodes used to shunt them are non-conducting under this condition. The use of resistances as collector loads is advantageous in that: the maximum voltage gain of each stage can be predicted, despite the construction of the gain-controlled amplifier in an IC, and this permits gain-controlled amplifier stages embodying the invention to be mass-produced in IC form without the need for individual adjustment of each amplifier stage in regard to maximum voltage gain. The maximum voltage gain of each amplifier stage is the product of the transconductance ($g_m$) of an emitter-coupled differential-amplifier transistor times the resistance ($R_L$) of its collector load. The $g_m$ of the transistor is determined by its emitter current flow, which current flow is made proportional to a applied bias voltage $V_{BIAS}$ (less, typically, a semiconductor junction offset voltage $V_{BE}$) applied across a resistive element with resistance $R_{BIAS}$ included on the IC with the resistive loads and arranged to be of the same type as the resistive loads. That is, the emitter current flow of the emitter-coupled differential-amplifier transistor is made to track a bias current $I_{BIAS} = (V_{BIAS} - V_{BE})/R_{BIAS}$, so its maximum voltage gain, $g_m R_L$, is proportional to $[(V_{BIAS} - V_{BE})/R_{BIAS}]R_L = (V_{BIAS} - V_{BE})(R_L/R_{BIAS})$. Since ($R_L/R_{BIAS}$) is the ratio of on-chip resistive elements, the value of this ratio is very well defined and can be accurately predicted. The few millivolt variation of $V_{BE}$ with temperature is usually negligible compared to ($V_{BIAS} - V_{BE}$), a voltage which depends on the bias voltage $V_{BIAS}$ applied from off-chip and can be arranged to have a well-predicted value. The value of $R_L$ is normally chosen to provide a maximum voltage gain of about twenty times for a controlled-gain amplifier stage.

Figure 7:
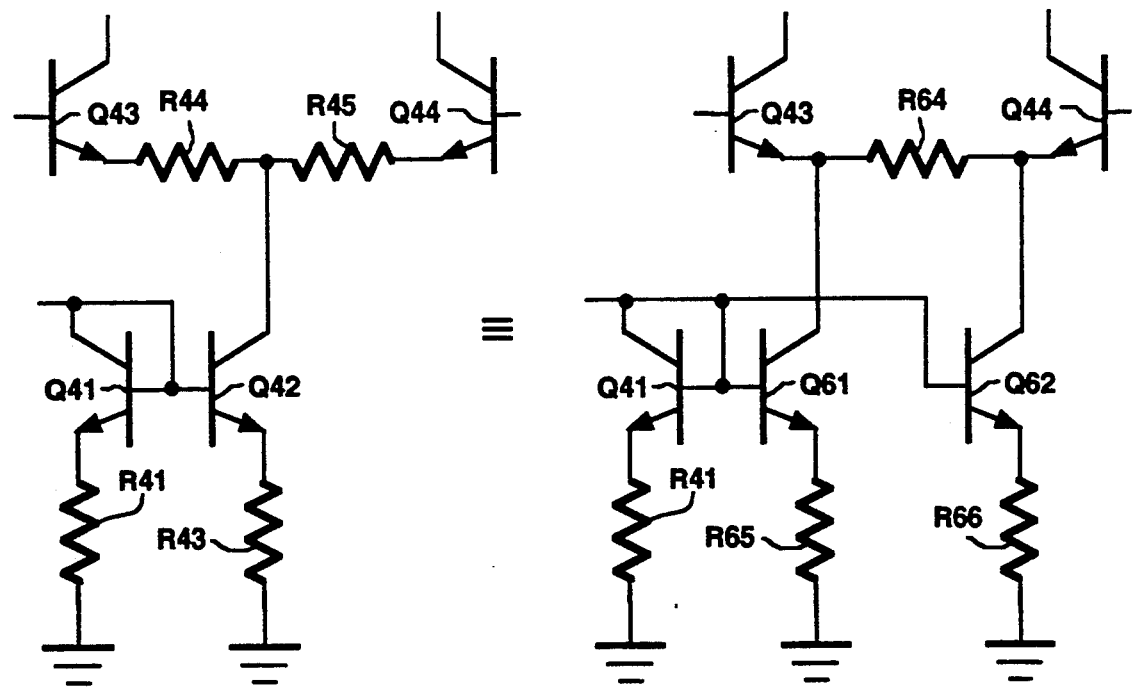
FIG. 7 is a schematic diagram of a modification that can be made to the FIG. 4 gain-controlled amplifier stage in another alternative embodiment of the invention.

The first stage of a PIX IF amplifier has to accommodate the full dynamic range of differential IF input potential signal to the amplifier, the amplitude of the IF signal supplied to the later stage(s) of the PIX IF amplifier being subject to a lesser dynamic range of input signal level owing to the gain control afforded by the first stage. The first stage of a PIX IF amplifier has to have the capability of avoiding overload on the peaks of the largest differential IF input signal received during strong-signal reception, when the gain control of the preceding RF amplifier runs out of range. The FIG. 1 gain-controlled amplifier is fitted for use as the first stage of a PIX IF amplifier, with the differential amplifier transistors Q4 and Q5 being emitter-coupled with substantial differential-mode resistance between their emitter electrodes. The linear differential-mode resistance provided by the resistors R5 and R6 permits the differential IF input signal potential between their base electrodes to reach as high about 100 millivolts RMS without either transistor being cut off on signal peaks. The differential-mode resistance between the emitter electrodes of transistors Q4 and Q5 can be provided in other known ways—e.g., by the resistance of the resistor R61 in the FIG. 7 pi network replacement for the FIG. 1 tee network connection of resistors R5, R6 and R7; by the resistance of a resistor corresponding to resistor R61 in another pi network that is a modification of the FIG. 7 pi network, in which other pi network transistors biased for constant-current-source operation replace the resistors R62 and R63; and by the combined resistances of the resistors R5 and R6 in a modification of the FIG. 1 tee network connection of resistors R5, R6 and R7 in which a transistor biased for constant-current-source operation replaces the resistor R7.

Figure 2:
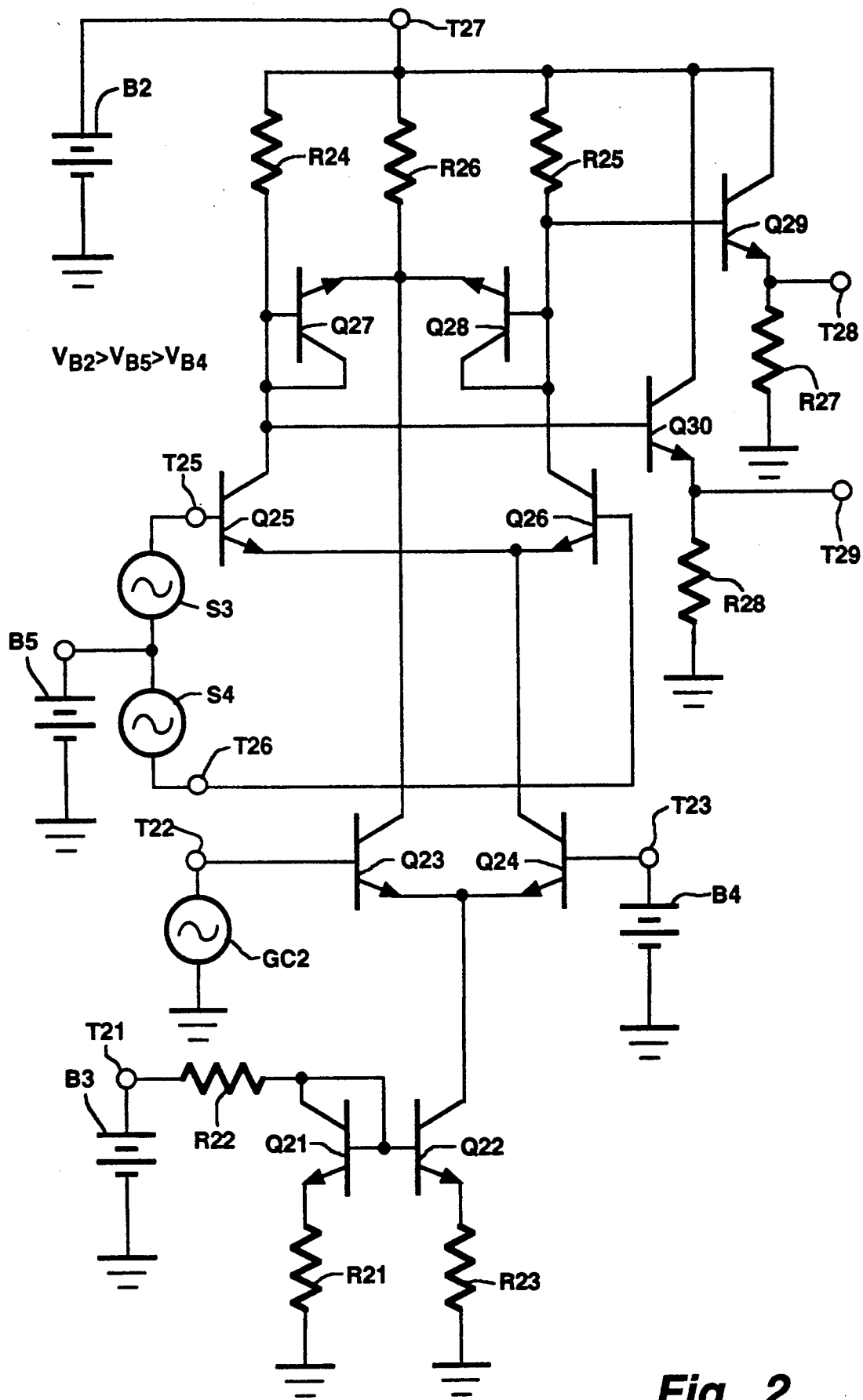
FIG. 2 is a schematic diagram of a gain-controlled amplifier stage that embodies the invention in one of its aspects and that is particularly well-suited for use as the output stage of a plural-stage IF amplifier.

In the FIG. 2 gain-controlled amplifier, a transistor Q21 is of NPN conductivity type and has its base and collector electrodes conductively joined so as to operate in a diode-connected mode. The emitter electrode of Q21 is connected via a series resistance R21 to a source of a reference potential, here shown as ground. A reference current is supplied to the joined base and collector electrodes via a resistance R22 having one end thereof connected thereto and another end thereof connected to receive a positive direct bias potential $V_{B3}$ applied to a terminal T21. FIG. 2 shows $V_{B3}$ as being supplied from a battery B3.

An NPN transistor Q22 has its emitter electrode connected to ground via a series resistance R23 and its base electrode connected to the base electrode of transistor Q21, so as to form a current mirror arrangement with respect to the reference current supplied via R22. NPN transistors Q23 and Q24 form a differential amplifier pair, having their respective emitter electrodes connected to the collector electrode of transistor Q22. The base electrode of transistor Q23 is connected to a terminal T22 for receiving a gain control signal thereat, herein represented as being supplied by a source GC2, and the base electrode of transistor Q24 is connected to a terminal T23 for receiving a positive direct bias potential $V_{B4}$ thereat, herein represented as being supplied by a battery B4.

NPN transistors Q25 and Q26 form a differential amplifier pair wherein their emitter electrodes are connected to the collector electrode of transistor Q24. Their base electrodes are connected to respective input terminals T25 and T26 for receiving a balanced input signal referred to a direct bias potential. FIG. 2 shows a battery B5 with its negative terminal connected to a point of ground reference potential supplying a direct bias potential $V_{B5}$ at its positive terminal against which are referred balanced input signals supplied by generators S3 and S4 to the terminals T25 and T26. The collector electrodes of transistors Q25 and Q26 are coupled via respective resistances R24 and R25 to a supply terminal T27 for receiving a positive operating potential $V_{B2}$, shown as being supplied from the battery B2. The collector electrode of transistor Q25 is further coupled to the joined collector and base electrodes of an NPN transistor Q27 and the collector electrode of transistor Q26 is further coupled to the joined collector and base electrodes of an NPN transistor Q28. The joined emitter electrodes of Q27 and Q28 are connected to the collector electrode of transistor Q23 and are further connected to terminal T27 by a resistance R26. NPN transistors Q29 and Q30 are arranged as voltage followers of the emitter-follower type, which serve as output buffer stages. The base electrodes of Q29 and Q30 connect to the collector electrodes of Q26 and Q25, respectively, and the collector electrodes of Q29 and Q30 connect to supply terminal T27. The emitter electrode of transistor Q29 is connected to an output signal terminal T28 and to one end of a resistance R27 the other end of which is connected to ground. The emitter electrode of transistor Q30 is connected to an output signal terminal T29 and to one end of a resistance R28 the other end of which is connected to ground.

In operation, current from the current mirror output at the collector electrode of transistor Q22 is steered by the transistor pair Q23 and Q24, between providing tail current for the differential-amplifier transistors Q25 and Q26 on the one hand, and providing bias current for diode-connected transistors Q27 and Q28, on the other hand. When the diode-connected transistors Q27 and Q28 carry no current, the gain is at its maximum value, being determined by maximum tail current and by the collector load resistances R24 and R25. When the AGC potential GC2 is made positive enough to bias transistor Q23 into conduction, the diode-connected transistors Q27 and Q28 are biased into conduction to shunt the collector resistances R24 and R25 of the transistors Q25 and Q26 to reduce their gain. At the same time the conduction of transistor Q23 reduces the current available for flow through Q24 and as tail current for the transistors Q25 and Q26, which reduced tail current operates them at reduced transconductance and thus reduces their gain further. In any event, the DC through each of resistances R24 and R25 is not disturbed by the operation of gain control. However, when more than half of the operating tail current for the differential amplifier pair is steered into the diode-connected transistors Q27 and Q28, noise performance will start to degrade. This is because of the poorer noise figures of the transistors Q25 and Q26 as their internal emitter resistances increase responsive to reduced current conduction by the principal conduction path of transistor Q24. Accordingly, the reduction of stage gain by the shunting of the collector load resistances R24 and R25 by diode-connected transistors Q27 and Q28 is the mechanism for gain reduction principally relied on, rather than reduction of the transconductances of Q25 and Q26 through starvation of their tail current. The normal range of gain control is upward from about 0 dB, then, to 26 dB or so.

The FIG. 2 gain-controlled amplifier is not particularly well-suited for use as the initial stage of a plural-stage IF amplifier, because it will overload rather quickly on overlarge input signals. Since the FIG. 2 gain-controlled amplifier relies more on diode shunting of the collector loads of the emitter-coupled transistors Q25 and Q26 than on reduction of their transconductances through starvation of their tail current, this shortcoming can be appreciably overcome by including emitter degeneration resistances for the transistors Q25 and Q26 in their emitter coupling. The modified stage still does not perform quite so well as the first stage of an IF amplifier as does either the FIG. 1 or FIG. 4 gain-controlled amplifier, because of the above-noted problem of noise figure being degraded as gain is cut back below 0 dB. In the later stage(s) of an IF amplifier, however, where the dynamic range of input signal to the stage(s) is reduced, the simpler construction of the FIG. 2 gain-controlled amplifier makes it the favored choice over the FIG. 1 or FIG. 4 gain-controlled amplifier.

Figure 3:
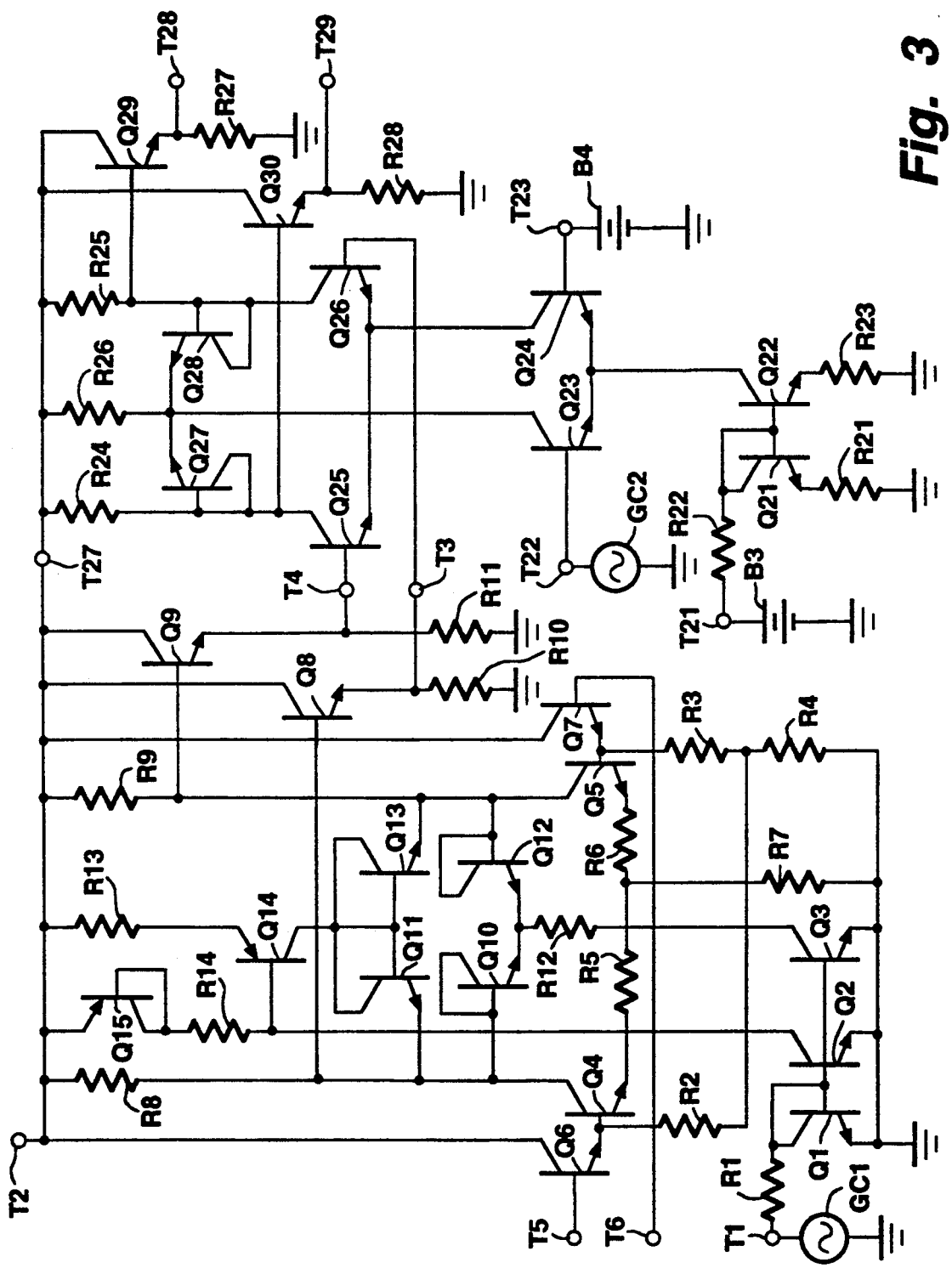
FIG. 3 is a schematic diagram of a two-stage IF amplifier that embodies the invention in one of its aspects and the employs the gain-controlled amplifier stages of FIGS. 1 and 2 as its input stage and as its output stage, respectively.

FIG. 3 shows a cascade connection of the FIG. 1 and FIG. 2 gain-controlled amplifiers. In operation, typically in television IF amplifier service, the two gain control signals at inputs T1 and at T22, respectively, are arranged to cooperate such that, when gain reduction starts to be applied, the gain of the second amplifier is first reduced without reducing the gain of the first amplifier. When the gain of the second amplifier has been reduced by a predetermined amount, subsequent amounts of gain reduction reduce the gain of both first and second amplifiers in a predetermined relationship. Thus, for small amounts of gain reduction, the first amplifier stage continues to operate at its full gain while overall gain reduction is achieved by reducing the gain of the second amplifier. As is known, such a mode of operation, known as delayed gain control, is beneficial to the overall noise performance because the contribution of the second amplifier is thereby kept small for smaller signals where amplifier noise may still be significant. In practice, such a delay is readily achievable by various means not shown here such as, for example, by the introduction of a voltage delay for the signal to the first amplifier.

The FIG. 1 and FIG. 2 amplifiers are suited for operation from a single positive operating supply, and FIG. 3 accordingly shows the supply terminal T27 connecting from the supply terminal T2. In practice the batteries B3 and B4 are replaced by networks within the same IC as the first and second gain-controlled amplifiers, which networks are of known type for deriving bias potentials from an operating supply potential as supplied via the supply terminal T2.

Figure 4:
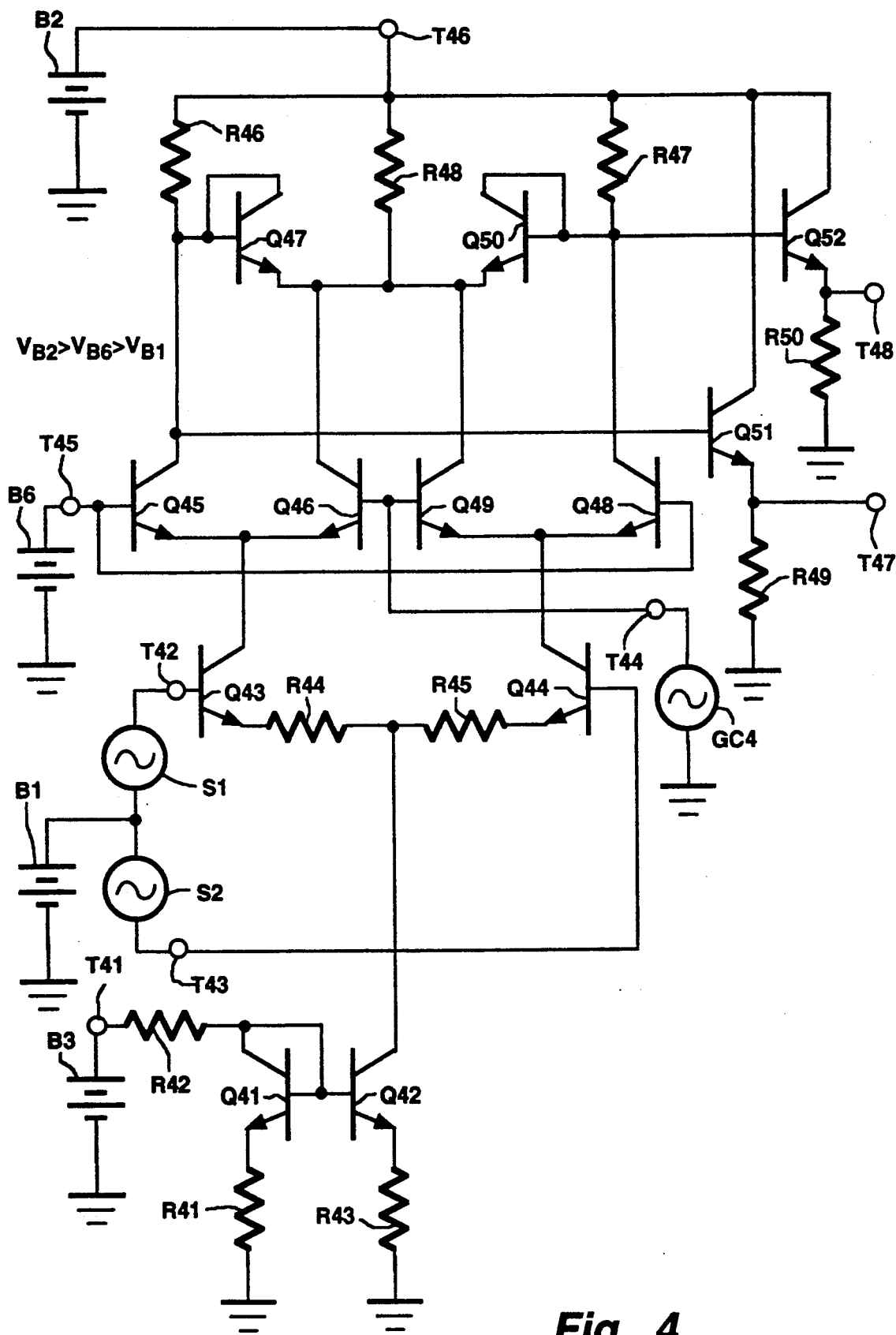
FIG. 4 is a schematic diagram of another gain-controlled amplifier stage that is particularly well-suited for use as the input stage of a plural-stage IF amplifier and that embodies the invention in one of its aspects.

FIG. 4 shows another gain-controlled amplifier that is well suited for use as the first stage in a television IF amplifier. The FIG. 4 amplifier includes a transistor Q41 of NPN conductivity type, which has its base and collector electrodes conductively joined so as to operate in a diode-connected mode. The emitter electrode of Q41 is connected via a series resistance R41 to a source of reference potential, shown as ground in FIG. 4. A reference current is supplied to the joined base and collector electrodes via a resistance R42 having one end thereof connected to them and having another end thereof connected to receive a positive operating potential $V_{B3}$ applied to a terminal T41. FIG. 4 shows the battery B3 supplying this potential.

An NPN transistor Q42 has its emitter electrode connected to ground via a series resistance R43 and its base connected to the base electrode of transistor Q41, so as to form a current mirror arrangement with respect to the reference current supplied by R42. NPN transistors Q43 and Q44 form a differential amplifier pair, having their respective emitter electrodes connected to the collector electrode of transistor Q42 via respective series resistances R44 and R45 and their base electrodes connected to respective input terminals T42 and T43 for receiving an input signal therebetween at an appropriate direct bias level. FIG. 4 shows signal sources S1 and S2 applying a balanced input signal to the input terminals T42 and T43, as referred to a positive direct bias potential $V_{B1}$ provided from the battery B1.

The NPN transistors Q45 and Q46 are connected as a current splitter for the collector current of transistor Q43, with each of them having its emitter electrode connected to the collector electrode of transistor Q43. The NPN transistors Q48 and Q49 are connected as a current splitter for the collector current of transistor Q44, with each of them having its emitter electrode connected to the collector electrode of transistor Q44. The base electrodes of transistors Q45 and Q48 are connected to receive a positive direct bias potential $V_{B6}$ applied to a terminal T45. FIG. 4 represents the source of $V_{B6}$ by a battery B6. The base electrodes of transistors Q46 and Q49 are connected to a terminal T44 for receiving a gain control voltage thereat, which FIG. 4 shows as being supplied from a source of control voltage GC4. The collector electrodes of transistors Q45 and Q48 are connected via a series resistance R46 and via a series resistance R47, respectively, to a supply terminal T46 to which a positive operating potential $V_{B2}$ is applied from the battery B2.

An electrically controllable conductance is provided between the ends of the resistances R46 and R47 remote from terminal T46. The joined collector and base electrodes of an NPN transistor Q47 and the collector electrode of transistor Q45 connect to the end of the resistance R46 remote from terminal T46. The joined collector and base electrodes of an NPN transistor Q50 and the collector electrode of transistor Q48 connect to the end of the resistance R47 remote from the supply terminal T46. The joined collector electrode and base electrodes of an NPN transistor Q47 connect to the collector electrode of transistor Q45. The emitter electrodes of transistors Q47 and Q50 and the collector electrodes of transistors Q46 and Q49 are all conductively joined and are connected to the supply terminal T46 via a series resistance R48.

The gain-controlled response appearing at the end of the resistance R46 remote from terminal T46 is applied to an output terminal T47 by the voltage-follower action of the NPN common-collector-amplifier transistor Q51 having an emitter load resistor R49 between its emitter electrode and a point of ground reference potential. The gain-controlled response appearing at the end of the resistance R47 remote from terminal T46 is applied to an output terminal T48 by the voltage-follower action of the NPN common-collector-amplifier transistor Q52 having an emitter load resistor R50 between its emitter electrode and a point of ground reference potential.

In operation, the collector output current of differential-amplifier transistor Q43 constitutes the tail current of differential pair transistors Q45 and Q46, which function as a current splitter. Depending on the control signal level at terminal T44, the collector output current of differential pair amplifier transistor Q43 can be steered through transistor Q45 or through transistor Q46 and thence through diode-connected transistor Q47, or partly through each of transistors Q45 and Q46. In symmetrical fashion, the collector output current of differential pair amplifier transistor Q44 can be steered through transistor Q48 or through transistor Q49 and thence through diode-connected transistor Q50, or partly through each of transistors Q48 and Q49.

The steering of currents to flow entirely through the transistors Q46 and Q49 applies the entire collector currents of transistors Q43 and Q44 including their differential variations to the node between the diode-connected transistors Q47 and Q50, where the differential signal variations cancel each other out at a "virtual ground" for AC. There are no components of Q45 and Q48 collector currents flowing through transistors Q46 and Q49, the differential variations of which can respectively flow to the load resistances R46 and R47 to cause corresponding signal voltages across them. The common-mode DC components of the collector currents of transistors Q43 and Q44 are in combined flow through the diode-connected transistors Q47 and Q50, causing their conductances to become relatively small respective to the load resistances R46 and R47, respectively. The low shunt resistances of the diode-connected transistors Q47 and Q50 determine the voltage gain of the FIG. 4 amplifier as they ratio against resistances R46 and R47, respectively. When the combined collector currents of transistors Q43 and Q44 are steered through diode-connected transistors Q47 and Q50, the gain will be at its minimum level.

The steering of currents to flow entirely through the transistors Q45 and Q48 applies the entire collector currents of the transistors Q43 and Q44 including their differential variations to the load resistances R46 and R47, respectively. The concomitant steering of currents away from the transistors Q46 and Q49 results in no current being steered through the diode-connected transistors Q47 and Q50, so their conductances are accordingly very low and do not shunt the load resistances R46 and R47 appreciably. The voltage gain of the FIG. 4 gain-controlled amplifier is therefore is at its maximum level.

The steering of the collector currents of the emitter-coupled differential amplifier transistors Q43 and Q44 partially through transistors Q45 and Q48 reduces gain by applying only a fraction of the differential variations of the collector currents to the load resistances R46 and R47, thereby reducing the corresponding signal voltages across them in a degree controlled by the gain control potential GC4. The steering of the collector currents of the emitter-coupled differential amplifier transistors Q43 and Q44 partially through transistors Q46 and Q49 at the same time further reduces gain by causing the common-mode components of the collector currents to flow through the diode-connected transistors Q47 and Q50, so their conductances shunt the load resistances R46 and R47 in a degree also controlled by the gain control potential GC4.

In any case, the total current in resistance R46 remains unchanged during the gain control process, being always equal to the collector output current of transistor Q43 and likewise, the total current in resistance R47 remains unchanged during the gain control process, being always equal to the collector output current of transistor Q44. Thus, if the transistors are well matched, there will be no disturbance of the DC conditions of operation of the amplifier as the gain is changed.

Similar advantages result with the FIG. 4 gain-controlled amplifier as were described in reference to the FIG. 1 gain-controlled amplifier. The FIG. 4 gain-controlled amplifier is fitted for use as the first stage of a PIX IF amplifier, with the differential-amplifier transistors Q43 and Q44 being emitter-coupled with substantial differential-mode resistance between their emitter electrodes in order to avoid overload distortion at expected IF amplifier input signal levels. The linear differential-mode resistance provided by the resistors R44 and R45 permits the differential IF input signal potential between their base electrodes to reach as high as about 100 millivolts RMS without either transistor being cut off on signal peaks. The various emitter-coupling networks described above with regard to the differential-amplifier transistors Q4 and Q5 can be used with differential-amplifier transistors Q43 and Q44 as well in other alternative embodiments of the invention.

Figure 5:
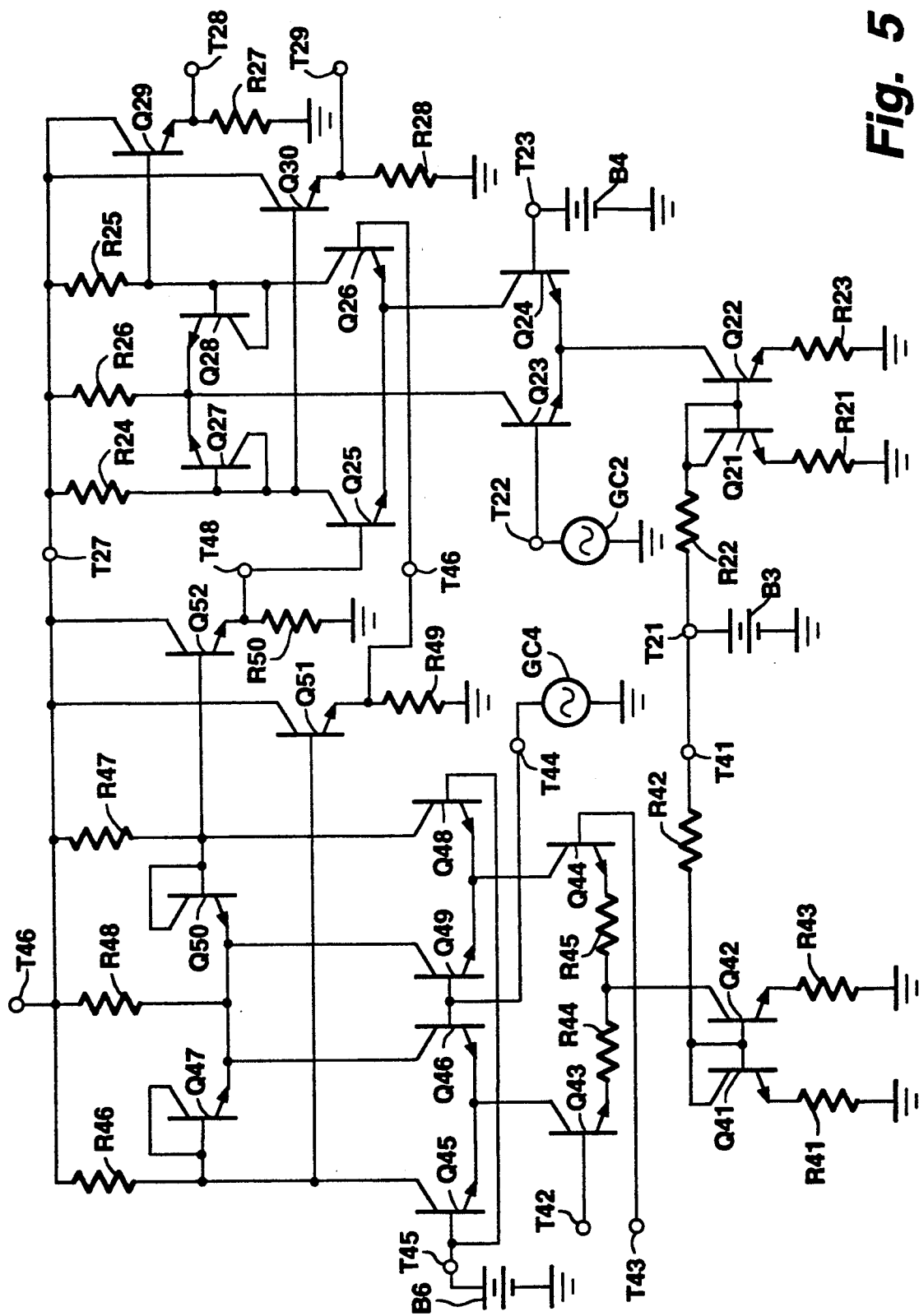
FIG. 5 is a schematic diagram of a two-stage IF amplifier that embodies the invention in one of its aspects and that employs the gain-controlled amplifier stages of FIGS. 2 and 4 as its output stage and as its output stage, respectively.

FIG. 5 shows a cascade connection of the FIG. 4 and FIG. 2 gain-controlled amplifiers. NPN transistors Q51 and Q52 with their respective resistors R49 and R50 form emitter-follower buffer stages for the output of the first amplifier. The input signal is applied at terminals T2 and T3 and the two gain control signals are applied at terminals T44 and T22, respectively. Similar considerations to the FIG. 3 embodiment are applicable regarding delayed gain control or delayed automatic gain control.

The FIG. 4 and FIG. 2 amplifiers are suited for operation from a single positive operating supply, and FIG. 5 accordingly shows the supply terminal T27 connecting from the supply terminal T46. In a variant of FIG. 5 the transistor Q42 receives its base potential from the joined collector and base electrodes of Q21 and elements R41, R42 and Q41 are dispensed with.

The gain-controlled amplifiers of FIGS. 2 and 4 are readily modified so that gain reduction is effected in increasing degree by an AGC voltage becoming increasingly negative, rather than by an AGC voltage becoming increasingly positive. In FIG. 2 terminal T22 rather than terminal T23 is connected to receive a direct bias potential $V_{B4}$, and terminal T23 receives the AGC voltage that becomes increasingly negative so that gain reduction is effected in increasing degree. In FIG. 4 terminal T44 rather than terminal T46 is connected to receive a direct bias potential $V_{B6}$, and terminal T46 receives the AGC voltage that becomes increasingly negative so that gain reduction is effected in increasing degree. The gain-controlled amplifier of FIG. 1 can also be modified so that gain reduction is effected in increasing degree by an AGC voltage becoming increasingly negative. One way to do this is to replace the current source and sink together comprising elements R1, Q2, Q3, R13, R14, Q14 and Q15 with: a single-output current mirror for sinking via the resistor R12 the combined emitter currents of Q10 and Q12 an output current scaled to an input current supplied to that current mirror; a dual-output current mirror having an input connection referred in potential to $V_{B2}$, having a first output connection for supplying the input current of the single-input current mirror, and having a second output connection for providing a current equal to the output current of the single-input current mirror as a source current to the combined base and collector currents of Q11 and Q13; and a resistor connected between terminal T1 and the input connection of the dual-output current mirror to generate an input current to that current mirror directly related to the AGC potential applied to terminal T1.

Figure 6:
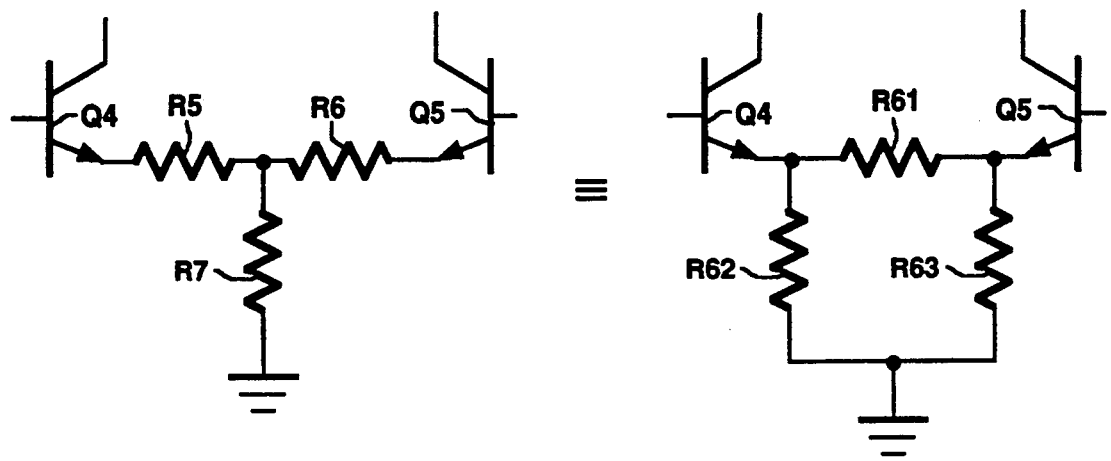
FIG. 6 is a schematic diagram of a modification that can be made to the FIG. 1 gain-controlled amplifier stage in an alternative embodiment of the invention.

FIG. 6 shows a modification that can be made to the FIG. 1 gain-controlled amplifier, in which modification the tee connection of resistors R5, R6 and R7 is replaced by an equivalent pi connection of resistors R61, R62 and R63. The resistance of R61 equals the sum of the resistances of R5 and R6; the resistance of R62 equals the sum of the resistances of R5 and R7; the resistance of R63 equals the sum of the resistances of R6 and R7.

FIG. 6 shows a modification that can be made to the FIG. 1 gain-controlled amplifier, in which modification the tee connection of resistors R44, R45 and the constant current source formed by transistor Q42 and resistor R43 is replaced by an equivalent pi connection of resistor R64 and two constant current sources, one formed by transistor Q61 and resistor R65, and the other formed by transistor Q62 and resistor R66. That is, the single-output current mirror comprising elements Q41, R41, Q42 and R43 is replaced by a dual-output current mirror comprising elements Q41, R41, Q61, R65, Q62 and R66.

The present invention is herein disclosed and its principles explained by way of exemplary embodiments. However, the invention is by no means limited to such embodiments, as will be apparent to one skilled in the art. Various changes and modifications can be incorporated without departing from the spirit of the invention. By way of example, the embodiments herein described utilize NPN amplifying transistors; clearly, PNP transistors can be substituted with appropriate circuit modifications as familiar to persons skilled in the art, or field effect transistors may be used instead of bipolar transistors, again with appropriate circuit modifications as are familiar to persons skilled in the art. Furthermore, other forms of current mirrors can replace the particular forms herein used by way of explanation. It is also contemplated that current steering need not be achieved by conventional differentially coupled pairs, though these have the advantage of simplicity, but it may also be performed by other circuits which can split an input current into two components having a variable ratio. While the foregoing exemplary embodiments have been described in the context of a PIX IF amplifier, they are adaptable for use at other frequencies such as baseband frequencies. These and like changes are contemplated to be within the scope of the invention as defined by the claims following.

What is claimed is:
1. A gain-controlled amplifier stage comprising:
   first and second transistors having respective emitter electrodes, respective base electrodes, and respective collector electrodes;
   means for connecting said first and second transistors in emitter-coupled differential amplifier configuration, which means includes
   means for applying a direct base bias voltage to the base electrode of said first transistor, means for applying said direct base bias voltage to the base electrode of said second transistor, means for applying an input signal voltage between the base electrodes of said first and second transistors, means for coupling the emitter electrodes of said first and second transistors together, and means for causing similar direct emitter current flows through said first and second transistors;

a first resistance, having a first end connected to conduct the entirety of a direct current flowing through the collector electrode of said first transistor responsive to its said direct emitter current flow, and having a second end;

a second resistance, having a first end connected to conduct the entirety of a direct current flowing through the collector electrode of said second transistor responsive its said direct emitter current flow, and having a second end;

means for receiving a direct operating voltage for application to the second ends of said first and said second resistances;

means for taking an output signal voltage from at least one of the first ends of said first and said second resistances; and means for providing a controllable conductance between the first ends of said first and said second resistances, which said means for providing a controllable conductance includes:

first and second diodes of unilaterally conductive type, having respective first electrodes respectively connecting to the first end of said first resistance and to the first end of said second resistance, and having respective second electrodes connecting together at a control node; and means for supplying a direct control current to said control node for controlling the unilateral conduction of said first and second diodes which direct control current has a value regulated responsive to an electric control signal, said electric control signal being applied to said means for supplying a direct control current through connections other than at the second ends of said first and said second resistances.

2. A gain-controlled amplifier stage as set forth in claim 1, wherein said means for coupling the emitter electrodes of said first and second transistors together comprises:

a third resistance, having a first end connected at the emitter electrode of said first transistor and having a second end;

a fourth resistance having a first end connected at the emitter electrode of said second transistor and having a second end connected to the second end of said third resistor; and means providing a conductive path between an interconnection of the second ends of said third and fourth resistances and a terminal for receiving a direct reference potential.

3. A gain-controlled amplifier stage as set forth in claim 1, wherein said means for coupling the emitter electrodes of said first and second transistors together comprises:

a resistance connected between the emitter electrode of said first transistor and the emitter electrode of said second transistor; and means providing similar conductive paths from the emitter electrode of said first transistor and from the emitter electrode of said second transistor to a terminal for receiving a direct reference potential.

4. A gain-controlled amplifier stage as set forth in claim 1, wherein said means for coupling the emitter electrodes of said first and second transistors together comprises:

an interconnection between the emitter electrodes of said first and second transistors to which each emitter electrode connects without substantial intervening impedance; and means providing a conductive path between said interconnection and a terminal for receiving a direct reference potential.

5. A gain-controlled amplifier stage as set forth in claim 1, wherein said means for applying an input signal voltage between the base electrodes of said first and second transistors is of a type for applying said input signal voltage in balanced drive to the base electrodes of said first and second transistors.

6. A gain-controlled amplifier stage as set forth in claim 1, wherein said means for applying an input signal voltage between the base electrodes of said first and second transistors is of a type for applying said input signal voltage as a single-ended drive to the base electrode of one of said first and second transistors.

7. A gain-controlled amplifier stage as set forth in claim 1, wherein said means for providing a controllable conductance between the first ends of said first and said second resistances comprises:

first and second nodes to which the first ends of said first and second resistors respectively connect without substantial intervening impedance;

third and fourth nodes;

means for supplying to said third node an electrically controlled current having a value determined in accordance with said electric control signal;

means for withdrawing from said fourth node an electrically controlled current substantially equal to that supplied to said third node, and having a value determined in accordance with said electric control signal;

first and second diodes with similar unilateral conduction characteristics to each other, having respective anode connections at said third node and having respective cathode connections at said first node and at said second node respectively; and third and forth diodes with similar unilateral conduction characteristics to each other, having respective cathode connections at said fourth node and respective anode connections at said first node and at said second node respectively.

8. A gain-controlled amplifier stage as set forth in claim 7 wherein each of said first, second, third and fourth diodes comprises a respective transistor with an emitter electrode providing the cathode of that diode and with interconnected collector and base electrodes providing the anode of that diode.

9. A gain-controlled amplifier stage as set forth in claim 7, wherein the collector electrode of said first transistor connects directly to the first end of said first resistance without any intervening element, and wherein the collector electrode of said second transistor connects directly to the first end of said second resistance without any intervening element.

10. A gain-controlled amplifier stage as set forth in claim 1 including:

a current splitter for dividing a direct bias current supplied thereto into first and second portions in a ratio as electrically controlled responsive to said electrical control signal, said current splitter connected for causing said first portion of said direct bias current to flow through an interconnection between the emitter electrodes of said first and second transistors.

11. A gain-controlled amplifier stage as set forth in claim 10 wherein said means for providing a controllable conductance between the first ends of said first and second resistances comprises:
   a first node to which the first end of said first resistance connects without substantial impedance and to which the collector electrode of said first transistor connects;
   a second node to which the first end of said second resistance connects without substantial intervening impedance and to which the collector electrode of said second transistor connects;
   a third node to which said current splitter connects for causing the second portion of said direct bias current to flow through said third node; and
   first and second diodes with similar unilateral conduction characteristics to each other between their respective first and second electrodes having respective similar ones of their electrodes connected at said third node and having their respective other electrode connections at said first node and at said second node respectively, thereby being poled for easy conduction of fractions of the second portion of said direct bias current flowing through them.

12. A gain-controlled amplifier stage as set forth in claim 1, wherein the collector current of said first transistor is divided into first and second portions by
   a first current splitter for dividing the collector current of said first transistor into first and second portions in a ratio as electrically controlled responsive to said electric control signal, wherein the collector current of said second transistor is divided into first and second portions by
   a second current splitter for dividing the collector current of said second transistor into first and second portions in said ratio as electrically controlled responsive to said electric control signal, and wherein said means for providing a controllable conductance between the first ends of said first and said second resistances comprises:
   a first node to which the first end of said first resistance connects without substantial intervening impedance and to which said first current splitter connects for causing the first portion of the collector current of said first transistor to flow through said first node;
   a second node to which the first end of said second resistance connects without substantial intervening impedance and to which said second current splitter connects for causing the first portion of the collector current of said second transistor to flow through said second node;
   a third node to which said first and second current splitters connect for causing the second portions of the collector currents of said first and second transistors to flow through said third node; and
   first and second diodes with similar unilateral conduction characteristics to each other between their respective first and second electrodes, having respective similar ones of their electrodes connected at said third node and having their respective other electrode connections at said first node and at said second node respectively, thereby being poled for easy conduction of second portions of the collector currents of said first and second transistors flowing through them.

13. A gain-controlled amplifier stage as set forth in claim 12 wherein said first current splitter comprises:
   third and fourth transistors having respective emitter electrodes connected together and to the collector electrode of said first transistor, having respective collector electrodes respectively connected to said first node and to said third node, and having respective base electrodes and wherein said second current splitter comprises
   fifth and sixth transistors having respective emitter electrodes connected together and to the collector electrode of said second transistor, having respective collector electrodes respectively connected to said second node and to said third node, and having respective base electrodes connected to the base electrode of said third transistor and to the base electrode of said forth transistor.

14. A gain-controlled amplifier stage comprising:
   first and second transistors having respective emitter electrodes, respective base electrodes, and respective collector electrodes;
   means for connecting said first and second transistors in emitter-coupled differential amplifier configuration, which means includes
   means for applying a direct base bias voltage to the base electrode of said first transistor,
   means for applying said direct base bias voltage to the base electrode of said second transistor,
   means for applying an input signal voltage between the base electrodes of said first and second transistors,
   means for coupling the emitter electrodes of said first and second transistors together, and
   means for causing similar direct emitter current flow as though said first and second transistors;
   a first resistance, having a first end connected to conduct the entirely of a direct current flowing through the collector electrode of said first transistor responsive to its said direct emitter current flow, and having a second end;
   a second resistance, having a first end connected to conduct the entirely of a direct current flowing through the collector electrode of said second transistor responsive its said direct emitter current flow and having a second end;
   a source of first control current, said source of first control current exhibiting a source impedance of said first and second resistances; and
   means for providing a controllable conductance between the first ends of said first and said second resistances, which said controllable conductance is arranged to be controlled responsive to said control current and comprises
   first and second variable conductance means having respective first ends connected to said respective first ends of said first and second resistances and having respective second ends connected together to receive said first control current from said source thereof.

15. A gain-controlled amplifier stage comprising:
   first and second transistors having respective emitter electrodes, respective base electrodes, means for connecting said first and second transistors in an emitter-coupled differential amplifier configuration, which means includes means for applying a direct base bias voltage to the base electrode of said first transistor, means for applying said direct base bias voltage to the base electrode of said second transistor, means for applying an input signal voltage between the base electrodes of said first and second transistors, means for coupling the emitter electrodes of said first and second transistors together, and means for causing similar direct emitter current flows through said first and second transistors;

first and second resistances having respective first ends coupled to the respective collector electrodes of said first and second transistors and respective second ends connected to a terminal for receiving a direct operating voltage;

a source of first control current said source of first control current exhibiting a source impedance value within a range extending upward from a value comparable with the impedance of said first and second resistances;

means for providing a controllable conductance between the first ends of said first and said second resistances, which said controllable conductance is arranged to be controlled responsive to said control current and comprises first and second variable conductance means having respective first ends connected to said respective first ends of said first and second resistances and having respective second ends connected together to receive said first control current from said source thereof;

a source of second control current having the same magnitude as said control current, but being of the opposite polarity, said source of second control current exhibiting a source impedance value within a range extending from a first value comparable with the impedance of said first and second resistance to a second value high in comparison therewith; and third and fourth variable conductance means having respective first ends connected to said respective first ends of said first and second resistances and having respective second ends together to receive said second control current from said source thereof, for providing a further controllable conductance responsive to said control current.

16. A gain-controlled amplifier stage as set forth in claim 15, wherein said control current has a magnitude dependent on a gain control signal.

17. A gain-controlled amplifier stages as set forth in claim 14, including current splitting means having a current input for receiving an input current and first and second outputs for splitting said input current in a controllable ratio between said first and second outputs, said first output being connected to said emitter electrodes of said first and second transistors for causing said direct tail current flow through said tail connection, and said second output being connected to said second ends of said first and second variable conductance means for providing said first control current.

18. A gain-controlled amplifier stage as set forth in claim 17, wherein said first control current has a magnitude dependent on a gain control signal.

19. A gain-controlled amplifier stage comprising:

first and second transistors having respective emitter electrodes, respective base electrodes, and respective collector electrodes;

means for connecting said first and second transistors in emitter-colored differential amplifier configuration, which means includes means for applying a direct base, bias voltage to the base electrode of said first transistor, means for applying a direct base bias voltage to the base electrode of said second transistor, means for applying an input signal voltage between the base electrodes of said first and second transistors, means for coupling the emitter electrodes of said first and second transistors together, and means for causing similar direct emitter current flows through said first and second transistors;

first and second resistances having respective first ends coupled to the respective collector electrodes of said first and second transistors and respective second ends connected to a terminal for receiving a direct operating voltage;

a source of first control current, said source of first control current exhibiting a source impedance value within a range extending upward from a value comparable with the impedance of said first and second resistances;

means for providing a controllable conductance between the first ends of said first and said second resistances, which said controllable conductance is arranged to be controlled responsive to said control current and comprises first and second variable conductance means having respective first ends connected to said respective first ends of said first and second resistances and having respective second ends connected together to receive said first control current from said source thereof; and first and second controllable current splitting means each having a respective current input for receiving a respective input current and respective first and second outputs for splitting its said respective input current in a controllable ratio between said its respective first and second outputs, said respective collector electrodes of said first and second transistors being connected to separate ones of the current inputs of said first and second current splitting means, said respective first outputs of said first and second current splitting means being connected respectively to said first ends of said first and second resistances and said respective second outputs of said first and second current splitting means being connected to said second ends of said first and second variable conductance means for providing said first control current.

20. A gain-controlled amplifier stage as set forth in claim 19, wherein said first control current has a magnitude dependent on a gain control signal.

21. A gain-controlled amplifier comprising:

first and second transistors connected as an emitter-coupled differential amplifier for responding to RF signals and having respective collector electrodes for supplying respective collector currents having respective common-mode DC components and having respective differential-mode RF components;

bridge diode load means having first, second, third, and fourth nodes, said first and second nodes being balanced with respect to said third and fourth nodes, said first and second nodes being connected to respective ones of said collector electrodes, said diode load means exhibiting between said first and second nodes a controllable impedance having a value controlled by current flow between said third and fourth nodes; and variable control current means comprising a current source output connected to said third node and a current sink output connected to said fourth node, said current source and sink outputs providing equal magnitudes of current.

22. A gain-controlled amplifier stage as set forth in claim 21 wherein said bridge diode load means comprises a first pair of diodes having respective anodes connected to said third node and having respective cathodes connected to said first and said second nodes respectively and a second pair of diodes having respective cathodes connected to said fourth node and having respective anodes connected to said first and said second nodes respectively.

23. A gain-controlled amplifier comprising:

first and second transistors having respective base, emitter and collector electrodes;

means for connecting said first transistor and said second transistor in a first emitter-coupled differential amplifier configuration, to cause said first and second transistors to supply from their respective collector electrodes respective collector currents having respective common-mode DC components and having respective differential-mode RF components responsive to RF signals of similar frequency received between their base electrodes;

a first controllable current splitter having an input for conducting a direct operating current, having first and second outputs connected for providing first and second fractional parts of aid direct operating current in a ratio determined in accordance with a first control signal, said first fractional part being apportioned to flow as respective direct emitter current flows through said emitter electrodes of said first and second transistors;

a first resistance connected between said collector electrode of said first transistor and a point of operating potential, for conducting the entirety of a direct current flowing through the collector electrode of said first transistor responsive to its said direct emitter current flow;

a second resistance connected between said collector electrode of said second transistor and said point of operating potential, for conducting the entirety of a direct current flowing through the collector electrode of said second transistor responsive to its said direct emitter current flow;

first diode means having a first electrode to which said collector electrode of said first transistor is connected and having a second electrode;

second diode means having a first electrode to which said collector electrode of said second transistor is connected and having a second electrode; and an interconnection between said second electrodes of said first and second diode means to which said second output of said first current splitter is connected.

24. A gain-controlled amplifier as set forth in claim 23 preceded in cascade by a further gain-controlled amplifier comprising:

third and fourth transistors having respective base, emitter and collector electrodes;

means for connecting said third and said fourth transistors in a second emitter-coupled differential amplifier configuration, to cause said third and fourth transistors to supply from their respective collector electrodes respective collector currents having respective common-mode DC components and having respective differential-mode RF components responsive to RF signals received between their base electrodes;

bridge diode load means having first, second, third, and fourth nodes, said first and second nodes being balanced with respect to said third and fourth nodes, said first node having the collector electrode of said third transistor connected thereto, said second node having the collector electrode of said fourth transistor connected thereto, said bridge diode load means exhibiting between said first and second nodes a controllable impedance having a value controlled by current flow between said third and fourth nodes;

variable control current means comprising a current source output connected to said third node and a current sink output connected to said fourth node, said current source and sink outputs providing equal magnitudes of current of a magnitude controlled by a second control signal;

a first voltage follower for applying a potential to the base electrode of said first transistor that follows the potential at said first node; and a second voltage follower for applying a potential to the base electrode of said second transistor that follows the potential at said second node.

25. A gain-controlled amplifier as set forth in claim 24 wherein said further gain-controlled amplifier further comprises:

a third resistance connected between said collector electrode of said third transistor and said point of operating potential; and a fourth resistance connected between said collector electrode of said fourth transistor and said point of operating potential.

26. A gain-controlled amplifier as set forth in claim 23 preceded in cascade by a further gain-controlled amplifier comprising:

third and fourth transistors having respective base, emitter and collector electrodes;

means for connecting said third and said fourth transistors in a second emitter-coupled differential amplifier configuration, to cause said third and fourth transistors to supply from their respective collector electrodes respective collector currents having respective common-mode DC components and having respective differential-mode RF components responsive to RF signals received between their base electrodes;

a second controllable current splitter, having an input connected for conducting collector current from said third transistor, and having first and second outputs for respectively conducting first and second fractional parts of the collector current from said third transistor in a ratio determined in accordance with a second control signal;

a third controllable current splitter, having an input connected for conducting collector current from said fourth transistor, and having first and second outputs for respectively conducting said first and second fractional parts of the collector current from said fourth transistor in a ratio determined in accordance with said second control signal;

a third resistance connected between said point of operating potential and a first node, to which said first node the first output of said second current splitter connects;

a fourth resistance connected between said point of operating potential and a second node, to which said second node the first output of said third current splitter connects;

third diode means having a first electrode connected to said first node and having a second electrode;

fourth diode means having a first electrode connected to said second node and having a second electrode;

a third node at which said second electrodes of said third and fourth diode means connect together and to which the second outputs of said second and third current splitters each connect;

a first voltage follower for applying a potential to the base electrode of said first transistor that follows the potential at said first node; and a second voltage follower for applying a potential to the base electrode of said second transistor that follows the potential at said second node.

27. A gain-controlled amplifier comprising:

first and second transistors having respective base, emitter and collector electrodes;

means for connecting the first and second transistors in an emitter-coupled differential amplifier configuration, to cause the first and second transistors to respond to RF signals received between their base electrodes for supplying from their respective collector electrodes respective collector currents having respective common-mode DC components and having respective differential-mode RF components;

a first controllable current splitter, having an input for conducting collector current from said first transistor, and having first and second outputs for respectively conducting said first and second fractional parts of said first current in a ratio determined in accordance with a control signal;

a second controllable current splitter, having an input for conducting collector current from said second transistor, and having first and second outputs for respectively conducting said first and second fractional parts of said second current in a ratio determined in accordance with said control signal;

a first resistance connected between said point of operating potential and a first node, to which said first node the first output of said first current splitter connects;

a second resistance connected between said point of operating potential and a second node, to which said second node the first output of said second current splitter connects;

first diode means having a first electrode connected to said first node and having a second electrode;

second diode means having a first electrode connected to said second node and having a second electrode; and a third node at which said second electrodes of said first and second diode means connect together and to which the second outputs of said first and second current splitters each connect.

* * * * *